(12) United States Patent
Bailey

(10) Patent No.: US 7,164,273 B2
(45) Date of Patent: Jan. 16, 2007

(54) POWER SOURCE MONITOR

(76) Inventor: David Bailey, 9921 Kenda Dr., Riverview, FL (US) 33569

( * ) Notice: Subject to any disclaimer, the term of this patent is extended or adjusted under 35 U.S.C. 154(b) by 187 days.

(21) Appl. No.: 10/847,488

(22) Filed: May 17, 2004

(65) Prior Publication Data

US 2005/0105230 A1    May 19, 2005

Related U.S. Application Data

(60) Provisional application No. 60/520,177, filed on Nov. 14, 2003.

(51) Int. Cl.
  *G01R 31/00* (2006.01)
  *H02H 3/26* (2006.01)
  *H02H 3/20* (2006.01)
  *H02H 3/24* (2006.01)

(52) U.S. Cl. .................. 324/508; 361/79; 361/90
(58) Field of Classification Search .................. 361/90, 361/79; 324/508
  See application file for complete search history.

(56) References Cited

U.S. PATENT DOCUMENTS

| | | | | |
|---|---|---|---|---|
| 4,672,501 A | * | 6/1987 | Bilac et al. | 361/96 |
| 4,823,227 A | * | 4/1989 | Grant | 361/90 |
| 5,144,232 A | * | 9/1992 | Veenstra | 324/177 |
| 5,748,008 A | * | 5/1998 | Landreth | 324/763 |
| 6,198,403 B1 | * | 3/2001 | Dorrough et al. | 340/635 |
| 6,218,824 B1 | * | 4/2001 | Oldstead et al. | 324/115 |
| 6,477,021 B1 | * | 11/2002 | Haun et al. | 361/42 |

* cited by examiner

*Primary Examiner*—Chau N. Nguyen
*Assistant Examiner*—Scott Bauer
(74) *Attorney, Agent, or Firm*—Arthur W. Fisher, III

(57) ABSTRACT

A power source monitor and method to monitor various operating line conditions of an electrical power outlet comprising measuring line voltage and frequency, analyzing wiring conditions, displaying the line conditions and generating an alarm when any of the line conditions are not within a corresponding predetermined range.

3 Claims, 2 Drawing Sheets

POWER SOURCE MONITOR

CROSS REFERENCE APPLICATION

This is a non-provisional patent application of provisional patent application Ser. No. 60/520,177 filed Nov. 14, 2003.

BACKGROUND OF THE INVENTION

1. Field of the Invention

A power source monitor and method to monitor operating line conditions of an electrical power outlet.

2. Description of the Prior Art

Various types of metering equipment are available to measure power line sources. The classic multimeter comprising two probes with selectable functions and ranges is cumbersome and awkward to use. The probes are placed into high voltage power receptacles, moved from hole to hole and require knowledge of systematic measurement techniques to analyze power source connections. Other testing devices simply plug into the receptacle to read the voltage and still other devices simply to test the wiring. Popular plug-in analog voltmeters are inexpensive but lack accuracy. They are average reading only for use only with sine wave sources. The small plug-in wire diagnostics testers are effective only for analyzing wiring combinations only. These products require that the user have both types used in sequence or to use two outlets. Most do not have back lighting, limiting use to days only. Some newer meters are multifunction with voltage, wiring diagnostics and sometimes frequency. They use LED displays that are difficult to read in direct sunlight and use average voltage measurement for sine wave sources. Meters require RMS or Root Mean Square technology to measure non-sine wave sources accurately. Such meters measure, not monitor. These meters lack audible alarms to indicate fault conditions, requiring periodic reading.

The original Digital Line Monitor Model 662 test device provided rectified average voltage measuring shown on an LED display along with wire diagnostics and surge protection. When introduced, Graphic Line Monitor Model 8040 included a color-coded bar graph display, wire diagnostics and surge protection.

Most meters on the market use rectified average voltage measurement and do not work on modified sine or square wave sources such as solid state generators, inverters and Uninterruptible Power Supplies (UPS) with useful accurately. The RMS voltage measurement technique is the only method for accurately measuring power sources. The RMS measurement value of a voltage source refers to power delivering capability or effective value. The RMS value is equal to the value of a DC source, which would deliver the same power if it were, replaced a time-varying AC source. For example if an rectified average measuring meter is used to measure a modified sine wave source at full duty cycle it will display a 29% error in its voltage reading. The cost of the RMS measuring equipment has been traditionally much more costly than average measuring devices, therefore only usually available in expensive digital multi-meters.

U.S. Pat. No. 5,144,232 discloses an example of testing devices typical of such instruments used to monitor various line conditions.

SUMMARY OF THE INVENTION

The present invention relates to a power source monitor for testing a standard 120 volt 15 amp outlet. The power source monitor may be temporarily plugged into an outlet or socket or may be attached or mounted on the outlet cover. The LCD display with back lighting allows the power source monitor to be used indoors and outdoors. This display technology provides a clear and readable display that can be seen in direct sunlight and at night.

The power source monitor uses a RMS voltage measurement technique. The RMS value of a source is determined by, first squaring the magnitude of the waveform at each instant. This makes the value of the magnitude a positive even when the original waveform has negative values. Then the average or mean value of the squared magnitudes is determined. Finally, the square root of this average is taken to get the result. The power source monitor further synchronizes the RMS measurement over a number of alternating current cycles to resolve errors due to the phase of the sampling. While the synchronized RMS measurement function is performed the power source frequency is measured. The synchronization qualification provides qualified edges for the alternating current zero crossings, that reduces interference that normally cause false frequency measurements. The zero crossing edges are qualified by repeated sampling and correlating the source voltage sequence to a reference voltage sequence.

The power source monitor will display the line voltage in RMS volts and then the line frequency. The LCD display will show an "F" in front of the number to denote frequency. The two readings are displayed alternately. The display modes can be changed by pressing the MODE button on the front panel of the power source monitor. The three modes VOLT/FREQ alt⇒VOLTAGE⇒FREQUENCY⇒back to VOLT/FREQ alt, cycle through as the "MODE" button or control is pressed.

When the power source monitor detects a fault condition, an audible alert is generated and a fault indication is displayed. The wiring faults are Ground Fault (GF) and Polarity Fault (PF). The voltage faults are Low voltage (LO) and High voltage (HI) when the measured line voltage is less than or greater than a predetermined voltage respectively. The frequency faults are Low Frequency (LO) and High Frequency (HF) when the measured line frequency is less than or more than a predetermined frequency respectively. The fault LED illuminates when one of the predetermined fault thresholds is exceeded. The fault thresholds must be activate and sustained for three seconds to engage the audible alert. Fault reset thresholds must be obtained to re-enable the fault alarms. When a wiring fault (GF or PF) is displayed, the MODE button may be used to sequence the display to show the current voltage or frequency by successive button actuations.

The surge protection or transient suppression on the input source lines, protects other devices on the same circuit by absorbing surges up to a predetermined amount with a maximum withstanding surge current of a predetermined amount.

The invention accordingly comprises the features of construction, combination of elements, and arrangement of parts which will be exemplified in the construction hereinafter set forth, and the scope of the invention will be indicated in the claims.

BRIEF DESCRIPTION OF THE DRAWINGS

For a fuller understanding of the nature and object of the invention, reference should be had to the following detailed description taken in connection with the accompanying drawings in which.

Similar reference characters refer to similar parts throughout the several views of the drawings.

DETAILED DESCRIPTION OF THE PREFERRED EMBODIMENT

The present invention relates to a power source monitor for use with a power source outlet to monitor measure and analyze various line condition including voltage, frequency and wire conditions at the power source outlet. The power source monitor may comprise a portable enclosure with a three-prong plug that connects to power line, neutral and ground. The power source monitor contains a digital display and diagnostic fault indicator enunciator with an audible alarm. An input mode switch is provided to select the different operation modes of the power source monitor. The power source monitor includes digital and analog circuitry that provides operational power, voltage scaling, and processing of the power line signals to generate display and alert outputs.

Figure 1:
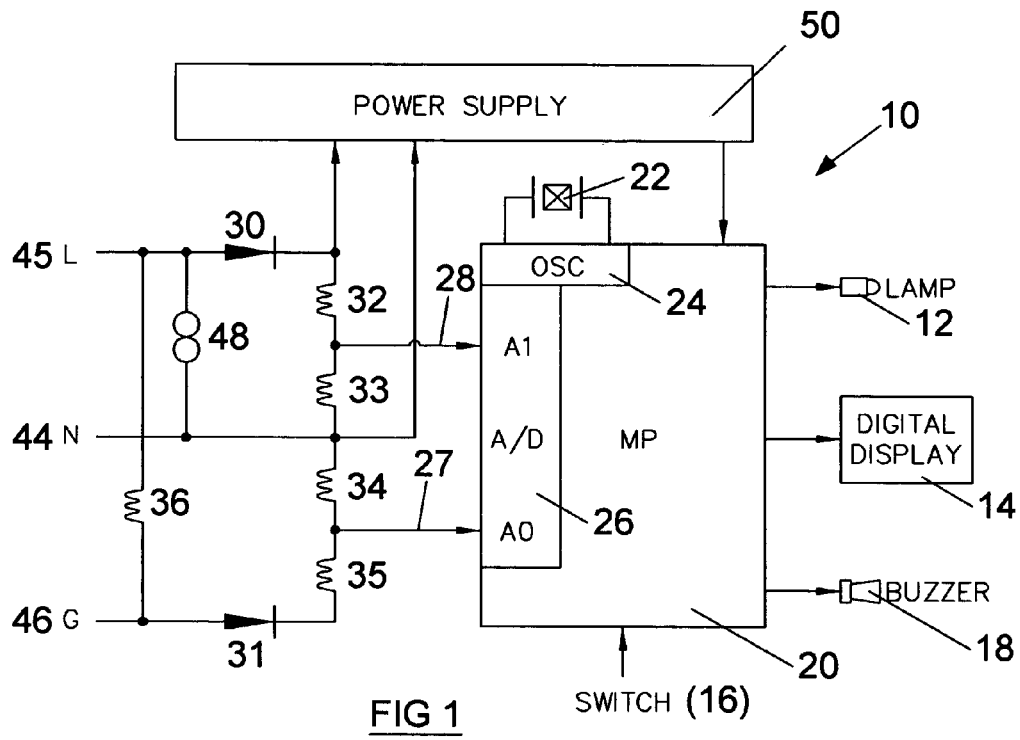
FIG. 1 is a schematic block diagram of the power source monitor of the present invention.

As shown in FIG. 1, the power source monitor generally indicated as 10 comprises a output section including an enunciator 12, a digital display 14 and an audible alarm 18 coupled to a microcontroller 20. An AC power source including a power line 45, neutral line 44 and a ground line 46 supplies the operating power and source signals for the power source monitor 10. The power line 45 is coupled with a diode 30 to feed a rectified DC signal to a power supply 50, the rectified power level is shifted through resistors 32 and 33 and feed to an analog to digital converter 26 in the microprocessor 20. The neutral line 44 is coupled to a metal oxide veristor 48 that protects the power source monitor 10 from power surges and coupled to the level shifting resistor 33 and the power source 50 to complete the power supply circuit. The ground line 46 is coupled to the resistor 36 to provide a pull up function in an open ground condition and to a rectifier 31 to provide a rectified signal to level shifting resistors 35 and 34. The resistor 34 is coupled to ground; while, the junction of the level shifting resistors 35 and 34 are coupled to the microprocessor 20 to provide the signal corresponding to the state of the ground line 46 with respect to the neutral line 44. The microprocessor 20 includes the analog to digital converter 26 to receive signals from the level shifted line 45 and the ground line 46 and an oscillator 24 controlled by a crystal 22 to provide the timing for operation of the power source monitor 10. A switch 16 is connected to the microcontroller 20 so that the operator can control the multi-mode operation of the power source monitor 10.

Figure 2:
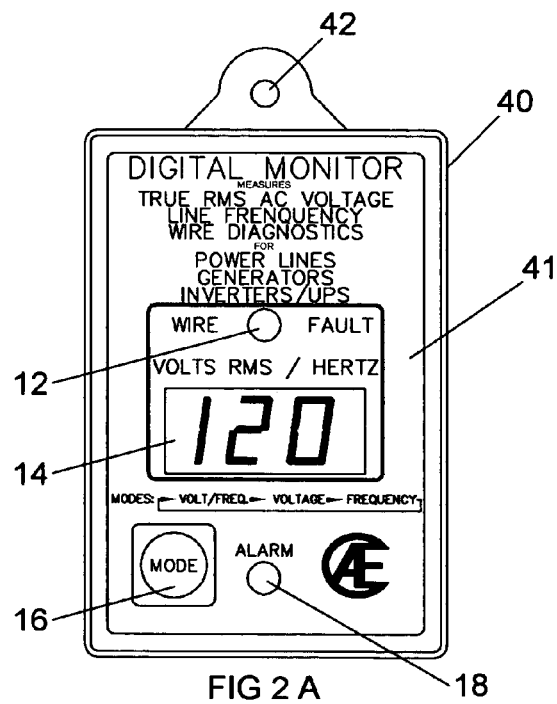
FIG. 2A is a front view of the power source monitor of the present invention.
FIG. 2B is a back view of the power source monitor of the present invention.
Figure 2:
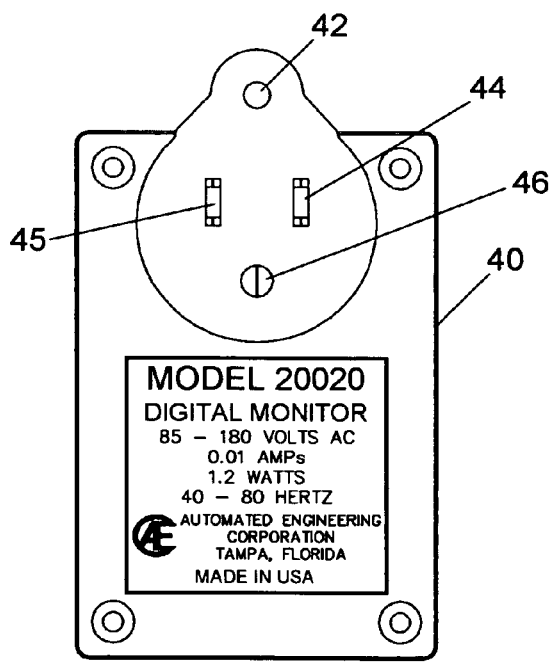

FIG. 2A shows the location or disposition of the enunciator 12, the digital display 14 and the audible alarm 18 on the front panel 39 of the power source monitor housing 40 having a mounting lug 42 formed thereto to attach the power source monitor 10 to a power outlet plate (not shown). The input mode switch 16 is also disposed on the front panel 39. FIG. 2B shows the plug terminals containing the power line 45, the neutral line 44, and the line ground 46.

Figure 3:
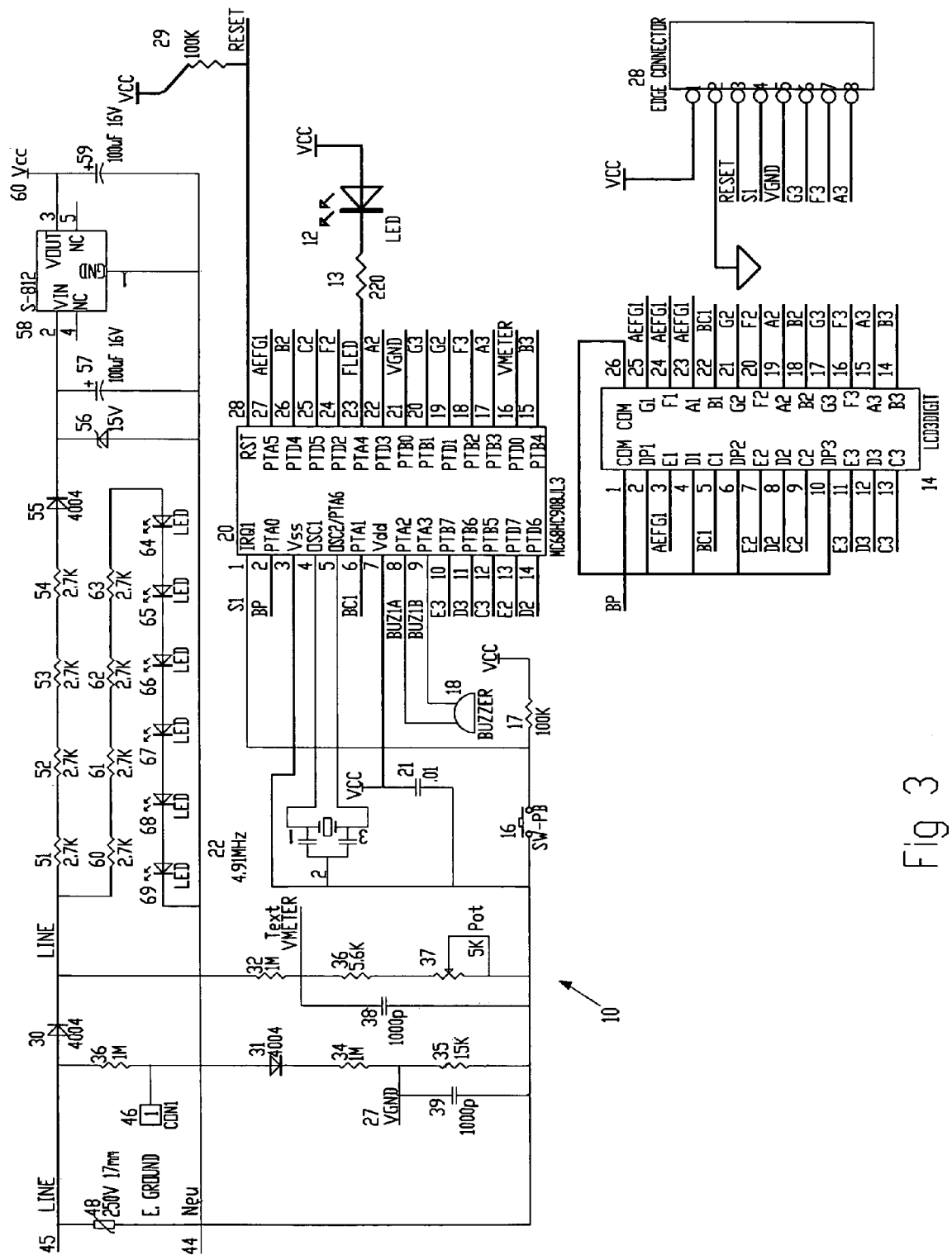
FIG. 3 is a schematic circuit diagram of the power source monitor of the present invention.

FIG. 3 is a schematic diagram of the power source monitor 10 electrically connected to the power line 45, the neutral line 44 and the ground line 46. The power line 45 supplies power with respect to the neutral line 44 with a the metal oxide veristor 48 electrically connected between the respective lines and the power line 45 further electrically connected to the diode 30 and the resistor 36. The rectified signal from the diode 30 supplies the operating power for the power source monitor 10 along with the signal to measure the operating line voltage and frequency. The power source is coupled through the diode 30 to resistors 51 through 54 to reduce the voltage to an operative level for the electronic circuitry. The resistor 54 is, in turn, electrically coupled to a diode 55 that is coupled to a zener diode 56 to provide a maximum input voltage coupled to a capacitor 57 to filter of the rectified source power and coupled to an IC regulator 58.

A VCC 60 such as 3 volts stabilized by a capacitor 59 is coupled to IC regulator 58. The capacitor 59 is connected to VCC 60 and neutral line 44, the ground terminal of regulator 58, the negative terminal of filter capacitor 57 and the zener diode 56. The rectified signal from the diode 30 coupled through a resistor 60 feeds through resistors 61, 62 and 63 coupled to LEDs 64 through 69 to provide the back lighting for the LED digital display 14 and the LED 69 coupled to the neutral line 44. The ground line 46 is connected to resistor 36 that provides a pull up open ground detection also connected to the power line 45. The ground terminal 46 is also connected to the diode 31 and the cathode of diode 31 to provide a rectified signal to resistor 34 coupled to the resistor 35 that references the neutral line 44. The connection between the resistors 34 and 35 provides a level shifted voltage that connects to a capacitor 39. The ground signal 27 is fed to the microprocessor 20 and the analog to digital converter 26. The capacitor 39 filters the ground voltage signal with reference to the neutral line 44. Rectified signals from the diode 30 are fed to resistor 32 coupled to resistor 36 through variable adjustable resistor 37 providing an adjustable shifted line voltage signal 28 coupled to the microprocessor 20 and the analog to digital converter 26; The level shifted line voltage signal 28 is also fed to capacitor 38 to provide filtering and the capacitor references the neutral line 44. The microprocessor 20 timing is supplied by the crystal or ceramic resonator timing device 22. The microprocessor 20 performs analog to digital conversion of the shifted line signal 28 and shifted the ground signal 27. The microprocessor 20 determines wiring diagnostics from the shifted ground signal 27 compared to predetermined operational voltage thresholds. A reading in the shifted ground signal 27 from about one third to about two thirds of the line voltage signal 28 indicates an open ground fault. Alternatively, the lower shifted ground signal threshold may comprise a substantially constant value such as about 20 volts. A reading in the shifted ground signal 27 of greater than about two thirds of the line voltage signal 28 indicates reverse polarity. In addition, the microprocessor 20 computes the RMS voltage by taking multiple instantaneous samples using the analog to digital converter and squares the rating, then take the sum of the squares, then computes the square root of the average resulting in the RMS value of the power source line voltage 45 with respect to power source neutral 44.

The microprocessor 20 further computes the power source frequency by counting the number of rectified pulses on the shifted line voltage 28 using the ceramic resonator 22 as the time base. Microprocessor 20 generates display messages on display 14 and enunciator 12 to show wiring diagnostics, RMS voltage and line frequency. Microprocessor 20 power source is filtered by capacitor 21 that is connected between VCC 60 and neutral 44. The buzzer 18 is coupled to the microprocessor 20 to generate the audible alerts in the event of fault conditions for 5 seconds or until the mode switch 16 is pressed. The liquid crystal display module 14 directly connects to the microprocessor 20 through the display the results of the measurement readings along with the fault condition messages. The resistor 29 is used as a pull-up for the reset of the microprocessor 20. The microprocessor 20 generates visual enunciator signal coupled to resistor 17 and the LED 12 and to VCC 60.

The power source monitor 10 is plugged into a standard 120 volt 15 amp type outlet. The power source monitor 10 can be mounted by attaching the unit with the center screw of the outlet cover. The viewing angle of the LCD display is optimized for viewing at a 12:00 o'clock viewing position. Looking directly down at the unit mounted in a low outlet gives the best viewing contrast. The LCD display with back lighting allows the power source monitor 10 power source monitor 10 used indoors and outdoors. This display technology provides a clear and readable display that can be seen in direct sunlight and at night.

The operation of the power source monitor 10 will display the line voltage in RMS volts and then the line frequency in Hertz. The LCD display will show a "F" in front of the number to denote frequency. The two readings will automatically alternate back and forth. The display modes may be changed by pressing the MODE button 16 on the front panel 41 of the power source monitor 10. The three modes VOLT/FREQ alt⇒VOLTAGE⇒FREQURNCY⇒back to VOLT/FREQ alt cycle through as the "MODE" button 16 is pressed or depressed.

When the power source monitor 10 detects a fault condition an audible alert sequence will be generated for a predetermined period such as 5 seconds and shows the cause for the fault on the display 14. The wiring faults are Ground Fault (GF) and Polarity Fault (PF). A first predetermined range for the voltage faults extend between Low voltage (LO) when the line voltage is less than a predetermined voltage such as 102 Vac or lower and High voltage (HI) when the line voltage is greater than a predetermined voltage such as 135 Vac or higher. Once the audible fault alarm 18 is activated, the power source monitor 10 generates a second predetermined voltage fault range or fault reset threshold such as 108 Vac and 128 Vac. When the voltage measured by the source monitor 10 comes within the second predetermined range, the indicator is reset and re-enabled to allow for subsequent activation upon detection of a subsequent fault condition.

The frequency faults are Low Frequency (LF) when the line frequency is less than a predetermined frequency such as less than 58 Hz and High Frequency (HF) when the line frequency is greater than a predetermined frequency such as over 62 Hz. The fault LED illuminates upon any fault threshold is exceeded. When a fault threshold is exceeded for a predetermined period such as three seconds the audible fault alarm is generated. Fault reset thresholds must be obtained to re-enable the fault alarms. When a wiring fault (GF or PF) is displayed, the MODE button 16 is used to sequence the display 14 to show the line voltage or line frequency by successive button actuations.

The surge protection (or transient suppression) on the input source lines, protects other devices on the same circuit by absorbing surges up to 300 joules with a maximum withstanding surge current of 10,000 amps.

It will thus been seen that objects set forth above, among those made apparent from the proceeding description are efficiently obtained since certain changes may be made in the above construction without departing from the scope of the invention, it is intended that all matter contained in the above description are shown in the accompanying drawings shall be interpreted as illustrative and not in a limiting sense.

Now that the invention has been described,

What is claimed is:

1. A method to monitor various operating line conditions of a three phase electrical power source comprising measuring and displaying line conditions and generating an indicator to indicate a fault condition when any of the line conditions are not within a corresponding predetermined range, said fault conditions include a voltage fault comprising of a low voltage fault when the line voltage is less than a first predetermined low voltage and a high voltage fault when the line voltage is greater than a first high predetermined voltage defining a first voltage fault range and a frequency fault comprising a low frequency fault when the line frequency is less than a predetermined low frequency and a high frequency fault when the line frequency is greater than a predetermined frequency defining a first frequency fault range, said voltage fault further comprises a second predetermined low voltage greater than said first predetermined low voltage and a second predetermined high voltage less than said first predetermined high voltage defining a second voltage fault range such that said indicator is re-enabled when the measured line voltage is within said second voltage fault range, said fault conditions further include a ground fault comprising an open ground fault, and a polarity fault comprising a reverse polarity fault, said fault condition indicates an open ground fault when the measured ground signal is within a first predetermined range relative to the line voltage and a reverse polarity fault when the measured ground signal is greater than a second predetermined range relative to the line voltage wherein the power line and neutral line are electrically coupled by a first pair of power level shifting resistors, and the neutral line and ground line are electrically coupled by a second pair of power level shifting resistors, and the power line and ground line are electrically coupled by a resistor providing a pull up function where an open ground condition exists.

2. The method of claim 1 wherein said indicator comprises a visual display of a fault when any of said line conditions are not within said corresponding predetermined range to indicate said fault condition.

3. The method of claim 1 wherein said frequency fault for said predetermined low frequency is less than about 58 Hz and said predetermined high frequency is greater than about 62 Hz.

* * * * *